(12) United States Patent
Belveze et al.

(10) Patent No.: US 6,389,574 B1
(45) Date of Patent: May 14, 2002

(54) METHOD FOR DETECTING A DISCRETE SYMBOL SEQUENCE FROM AN OBSERVATION SIGNAL, AND VITERBI PROCESSOR IMPLEMENTING SUCH METHOD

(75) Inventors: Fabrice Belveze, Maurepas; Florence Chancel, Versailles, both of (FR)

(73) Assignee: Matra Nortel Communications (FR)

( * ) Notice: Subject to any disclaimer, the term of this patent is extended or adjusted under 35 U.S.C. 154(b) by 0 days.

(21) Appl. No.: 09/275,425

(22) Filed: Mar. 24, 1999

(30) Foreign Application Priority Data

Mar. 25, 1998 (FR) .............................. 98 03681

(51) Int. Cl.$^7$ ............................................ H03M 13/03

(52) U.S. Cl. ..................... 714/795; 714/794; 714/796

(58) Field of Search ............................ 714/792, 780, 714/794–796, 786; 708/323, 319; 375/231, 232, 347, 341, 316, 317, 322, 376, 377; 370/292; 455/132

(56) References Cited

U.S. PATENT DOCUMENTS

| | | | | |
|---|---|---|---|---|
| 4,328,582 | A | | 5/1982 | Battail et al. ............... 714/780 |
| 5,329,537 | A | * | 7/1994 | Alard et al. ................ 714/794 |
| 5,390,198 | A | * | 2/1995 | Higgins ...................... 714/796 |
| 5,541,955 | A | * | 7/1996 | Jacobsmeyer ............... 375/222 |
| 5,586,128 | A | * | 12/1996 | Chen .......................... 714/792 |
| 5,920,599 | A | * | 7/1999 | Igarashi ...................... 375/341 |
| 5,953,383 | A | * | 9/1999 | Kojima ........................ 375/347 |
| 6,002,716 | A | * | 12/1999 | Meyer et al. ................ 375/231 |
| 6,009,552 | A | * | 12/1999 | Ariel et al. ................. 714/780 |
| 6,044,111 | A | * | 3/2000 | Meyer et al. ................ 375/231 |
| 6,195,782 | B1 | * | 2/2001 | Rahmatullah et al. ...... 714/796 |
| 6,263,473 | B1 | * | 7/2001 | Kamada ..................... 714/795 |

FOREIGN PATENT DOCUMENTS

| | | | |
|---|---|---|---|
| EP | 0 727 890 | 8/1996 | ............. H04L/1/00 |
| EP | 0 821 500 | 1/1998 | ............. H04L/1/00 |

OTHER PUBLICATIONS

Hekstra (An alternative to metric rescaling in Viterbi decoders; IEEE, Nov. 1989).*

Wells et al.(Simplified calculation of likelihood metrics for Viterbi decoding in partial response systems; IEEE, Sep. 1996).*

Fitzpatrick et al.(A difference metric implementation for maximum–likelihood sequence estimation of binary input intersymbol interference channels; IEEE, Nov. 13–17, 1995).*

Vityaev et al. (Improved estimates of Viterbi detector path metric differences; IEEE, Nov. 18–22, 1996).*

Calderbank et al. (Covering properties of convolutional codes and associated lattices; IEEE, May 1995).*

Mobile Radio Communications, Steele, R; Pentech Press, 1992, 1st Ed.; pp. 348–349, 366–371.*

(List continued on next page.)

*Primary Examiner*—Albert Decady
*Assistant Examiner*—Guy Lamarre
(74) *Attorney, Agent, or Firm*—Trop, Pruner & Hu, P.C.

(57) ABSTRACT

The detection of symbols of a sequence on the basis of an observation signal is performed in accordance with a soft output Viterbi algorithm using a trellis. In order to assign a likelihood to a discrete estimation of a symbol, the difference between the metrics of the optimal path determined in accordance with the Viterbi algorithm and the metrics of a competitor path, which is optimal among all the paths leading to a different decision for the symbol in question is calculated, the metrics being considered on the whole length of the trellis.

26 Claims, 6 Drawing Sheets

OTHER PUBLICATIONS

Nill C., et al., <<Viterbi Algorithms with List and Soft Symbol Output: Extensions and Comparisons >>, Institute of Electrical and Electronics Engineers, Proceedings of the Global Communications Conference (Globecom), Houston, USA, Nov. 29, –Dec. 2, 1993, vol. 2, pp. 788–792.

Berrou C., et al, <<A Low Complexity Soft–Output Viterbi Decoder Architecture >>, Institute of Electrical and Electronics Engineers, Proceedings of the International Conference on Communications (ICC), Geneva, Switzerland, May 23–26, 1993, vol. 2, pp. 737–740.

Li Y., et al., <<Optimum Soft–Output Detection for Channels with Intersymbol Interference >>, IEEE Transactions on Information Theory, May 1995, vol. 41, No. 3, pp. 704–713.

Hagenauer J., et al., <<A Viterbi Algorithm with Soft–Decision Outputs and its Applications >>, Institute of Electrical and Electronics Engineers, Communications Technology for the 1990's and Beyond, Dallas, USA, Nov. 27–30, 1989, vol. 3, pp. 1680–1686.

Abend K., et al., <<Statistical Detection for Communication Channels with Intersymbol Interference >>, Proceedings of the IEEE, May 1970, vol. 58, No. 5, pp. 779–785.

Chang R.W., et al., <<On Receiver Structures for Channels Having Memory >>, IEEE Transactions on Information Theory, Oct. 1966, pp. 463–468, vol. IT–12.

Forney G.D., <<The Viterbi Algorithm >>, Proceedings of the IEEE, Mar. 1973, vol. 61, No. 3, pp. 268–278.

Rimoldi B.E., <<A Decomposition Approach to CPM >>, IEEE Transactions on Information Theory, Mar. 1988, vol. 34, No. 2, pp. 260–270.

Bahl L.R. et al., <<Optimal Decoding of Linear Codes for Minimizing Symbol Error Rate >>, IEEE Transactions on Information Theory, Mar. 1974, vol. IT–20, pp. 284–287.

Lodge J., et al., <<Separable Map "Filters" for the Decoding of Product and Concatenated Codes >>, Communications Research Centre, Ottawa, Canada, pp. 1740–1745.

* cited by examiner

METHOD FOR DETECTING A DISCRETE SYMBOL SEQUENCE FROM AN OBSERVATION SIGNAL, AND VITERBI PROCESSOR IMPLEMENTING SUCH METHOD

BACKGROUND OF THE INVENTION

The present invention concerns the field of digital transmissions.

We consider the transmission of digital data, i.e. in the form of symbols taking a finite number ND of values $d^0, \ldots, d^{ND-1}$, and discrete in time: it is therefore a digital symbol sequence $D_m$ (m=0,1,2,etc.) belonging to a defined alphabet $\{d^i, 0 \leq i < ND\}$.

The role of the detector, in terms of the present invention, is to provide estimations of successive symbols $D_m$ in a sequence to be detected from an "encoded" observation signal available at a receiver. The "encoder", which provides the observation signal representing the sequence to be detected to the detector must be taken in the most general sense: it can be seen as a black box, developed by the designer or not. It may be an error correcting encoder (in this case, the observation signal is also a digital signal, and the "detector" is a correcting decoder), or the compound of a correcting encoder-modulator-propagation channel-demodulator (the observation signal is then a digital sequence marred by errors), or else the more straightforward compound of a modulator-propagation channel (the "detector" is then a demodulator).

The detector has hard inputs if the observation signal which it processes is a digital sequence of symbols with discrete values, and soft inputs if the observation signal is a sequence of sampled and quantified values, or of discrete estimations accompanied by respective weights representing the degrees of confidence vested in these estimations.

The detector has soft outputs if the symbol estimations which it delivers are accompanied by respective weights representing the degrees of confidence vested in these estimations, and hard outputs if it simply delivers discrete estimations.

In real transmission systems, it is common to process signals having a memory, i.e. the signal segment carrying the data at a given moment depends not only on this data at the same moment, but also on the past data or past signal segments. If this memory verifies certain properties, particularly the fact that a trellis exists describing the production process of the observation signal, then the receiver can determine the data symbols carried by the observation signal in the sense of maximum likelihood, by means of the Viterbi algorithm (see G. D. Forney, Jr., "The Viterbi Algorithm", Proc. IEEE, Vol.61, No.3, March 1973, pages 268–278) or the MAP (Maximum A Posteriori) algorithm also set out in the article by G. D. Forney.

Different versions of the MAP algorithm are described in the following references: K. Abend and B. D. Fritchman, "Statistical Detection for Communication Channels with Intersymbol Interference", Proc. IEEE, Vol.58, No.5, May 1970, pages 779–785; R. W. Chang and J. C. Hancock, "On Receiver Structures for Channels Having Memory", IEEE Trans. on Information Theory, Vol.IT-12 No.4, October 1966, pages 463–468; and L. R. Bahl et al, "Optimal Decoding of Linear Codes for Minimizing Symbol Error Rate", IEEE Trans. on Information Theory, Vol.IT-20, March 1974, pages 284–287.

It also happens that "encoders" $COD_1, COD_2, \ldots, COD_N$ are cascaded in transmission systems (for example several error correcting encoders, or one or several error correcting encoders followed by a modulator and a propagation channel), often with intermediate interleaving operations. In this case (concatenated memory system), the receiver under consideration may consist of a cascade of elementary decoder/detectors $DEC_N, DEC_{N-1}, \ldots, DEC_1$. This receiver is optimal in the sense of maximum likelihood if the decoder/detectors $DEC_p$ have soft outputs (for p>1) and soft inputs, whereby the decoder/detector $DEC_p$ (p>1) associates with each discrete estimation of a decoded symbol $D_m$ of the sequence to be detected (this sequence is the one delivered by the encoder $COD_{p-1}$) a weight represented by the likelihood equal or proportional to the logarithm of the ratio between the probability that the symbol $D_m$ of the unknown sequence does in fact correspond to its estimation provided by the decoding and the probability that the symbol $D_m$ is different from its estimation, the probabilities in question being conditional probabilities, with the knowledge of the available observation signal. In this case, the soft outputs of each decoder/detector constitute the "observation signals" for the next decoder/detector, and the likelihood data is not lost.

The advantage of the Viterbi algorithm is that its implementation by a circuit or a processor entails no great difficulties. given the straightforwardness of the operations involved: multiplications, additions/subtractions, comparisons. Furthermore, the regularity of the trellis often enables the use of tricks for programming or organising the memory, which make the algorithm even easier to implement. This explains why its use is today widespread in different categories of detector. But, in its traditional version, it does not provide the likelihood of the discrete estimations which it delivers, so that it does not allow optimal processing in the case of a concatenated memory system.

On the other hand, the MAP algorithm, in essence, provides the likelihoods of the symbols that it estimates, but poses serious difficulties of implementation: exponential quantity calculations, need to know the noise variance, sensitivity to errors in this variance, problems of digital analysis for its very low values etc.

For the concatenated memory systems mentioned above, several methods have been proposed for weighting the estimations produced by a Viterbi detector. Examples of such methods, referred to as "SOVA" (Soft Output Viterbi Algorithm), are:

a method consisting in taking as the likelihood of an estimation the difference between the metric accumulated at a node of the trellis corresponding to this estimation and the metric of the best path corresponding to a different discrete estimation (see C. Berrou et al, "A Low Complexity Soft-Output Viterbi Decoder Architecture", Proc. ICC'93, Geneva, May 1993). This straightforward technique is commonly employed, but very sub-optimal;

the Hagenauer algorithm, described in J. Hagenauer and P. Hoeher, "A Viterbi Algorithm with Soft-Decision Outputs and its Applications", Proc. Globecom'89, Dallas, November 1989, pages 47.1.1–47.1.7;

the Battail algorithm, described in U.S. Pat. No. 4,328, 582;

the optimal (OSA) or sub-optimal (SSA) SOVA described in Y. Li, B. Vucetic and Y. Sato, "Optimum Soft-Output Detection for Channels with Intersymbol Interference", IEEE Trans. on Information Theory, Vol. IT-41, No.3, May 1995, pages 704–713.

Except for the OSA, each of these SOVA methods bring a degradation of performance compared with the MAP algorithm.

The Hagenauer, Battail and Li, Vucetic and Sato algorithms are similar to the MAP in that they carry out the calculations in the probability domain. As a result, they involve the calculation of exponentials, which makes their implementation by means of circuits or processors unattractive, even if the exponential quantities are replaced by approximations.

A primary object of the present invention is to propose a SOVA method of reasonable complexity, allowing an evaluation of likelihoods of symbols estimated by a Viterbi detector, and which brings little error probability degradation compared with the optimal case of the MAP algorithm.

SUMMARY OF THE INVENTION

This invention thus proposes a method for detecting a discrete symbol sequence from an observation signal the production of which can be described by means of a trellis of NE states $E_e$ ($0 \leq e < NE$) and NB branches $B_b$ ($0 \leq b < NB$), each branch having a start state and an arrival state among the NE states and being associated with a single Q-uplet of discrete symbols, Q being an integer at least equal to 1, the trellis comprising paths each formed by a succession of branches, each path having a metric defined by a sum of elementary metrics relative to the successive branches which form it, and being associated with a single possible sequence of discrete symbols formed by the succession of Q-uplets with which the successive branches forming said path are respectively associated, wherein the observation signal is processed by successive time segments, the processing of a segment n of the observation signal including.

for each of the NB branches $B_b$ ($0 \leq b < NB$), obtaining an elementary metric corresponding to a combination between the segment n of the observation signal and a reference signal associated with the branch $B_b$, and the calculation of an accumulated branch metric $MBA_b(n)$ by adding the elementary metric obtained to an accumulated state metric $MEA_e(n-1)$ relative to the start state $E_e$ of the branch $B_b$; and for each of the NE states $E_e$ ($0 \leq e < NE$), updating the accumulated state metric $MEA_e(n)$, taken as equal to an optimum of the accumulated branch metrics $MBA_b(n)$ relative to those of the branches $B_b$ which have the state $E_e$ as the arrival state, and storing an identification of a surviving branch for which said optimum is reached, wherein, after processing successive segments of the observation signal, a selection is made of one of the NE states $E_{e0}$ and of an optimal path $\alpha_{opt}$ of the trellis formed by returning up the surviving branches from the selected state, and at least one discrete symbol $D_m$ of the sequence to be detected is estimated by the value of a corresponding symbol of the sequence with which the selected optimal path is associated, and wherein, for each symbol $D_m$ of the sequence to be detected, estimated after the selection of a state $E_{e0}$ and of an optimal path $\alpha_{opt}$, a minimum difference in metrics is calculated between the optimal path and a competitor path associated with a sequence in which the symbol corresponding to the symbol $D_m$ has a value other than the estimation retained for the symbol $D_m$ and the likelihood $\Lambda_m$ of the estimation of the symbol $D_m$ is determined as a function of the calculated minimum difference in metrics.

The likelihood $\Lambda_m$ of the estimation of a symbol $D_m$ may particularly be taken as equal or proportional to the minimum difference in metrics calculated for this symbol.

The inventors have observed (by simulation) that this detection method gives performances close to the MAP as regards the error rate. Its other advantage is that it uses the same type of straightforward processes as the conventional Viterbi algorithm (only additions/subtractions and comparisons). It is of comparable complexity: the number of calculations required to obtain the likelihoods is approximately equivalent to that required by the discrete output Viterbi algorithm. But it has the great advantage of producing the likelihoods of the decisions. It is known that on a simple Gaussian channel, there may be a saving of up to nearly 3 dB (for the large signal-to-noise ratios) on each of the decoding stages. There is therefore great benefit in having such a process available.

The applications targeted are decoding concatenations, including:

- demodulation of a memory system, which is to be followed by soft input decoding of a convolutional code (with or without interleaving) or of a block code; the memory system may be a transmission on a channel with inter-symbol interference, and/or a linear or continuous phase modulation (CPM, an example of which is GMSK: "Gaussian minimum shift keying");

- two (or more) soft decodings of concatenated convolutional codes (with or without the presence of interleaving between the codes); an example of application in this case is the decoding of turbo-codes; or else the soft decoding of a convolutional code followed by the soft decoding of a block code;

- the soft decoding of a convolutional code, followed by an image or speech decoder, which would need to know the quality of the decoded symbols (binary or not), so as to improve the quality of the restored signal (example: speech decoder in a GSM-type cellular radio-communication system);

- in a pattern recognition system (recognition of images, characters or speech) using modelling by hidden Markov chains (and which therefore generally uses a Viterbi algorithm to make its decision) and needing to know the decision likelihood (for example so as not to make a decision in the event of the likelihood not reaching a certain threshold).

In a preferred version of the method, during the processing of L0+L1 successive time segments n−r of the observation signal up to a segment n (n−L0−L1<n−r≦n), L0 being a positive or zero integer and L1 being a strictly positive integer, for each branch b ($0 \leq b < NB$) is stored the difference $\delta_b(n-r) = |MBA_b(n-r) - MEA_e(n-r)|$ between the accumulated branch metric $MBA_b(n-r)$ and the accumulated state metric $MEA_e(n-r)$ updated for the arrival state $E_e$ of the branch $B_b$. After the processing of L1 successive segments of the observation signal up to a segment n and the selection of a state $E_{e0}$, a recursive-calculation is made on the basis of the differences in metrics stored during the processing of the previous L0+L1 segments n−r (n−L0−L1<n−r≦n), in order to determine the minimum difference in metrics relative to each symbol $D_m$ estimated by means of the sequence with which is associated the optimal path determined by returning up the surviving branches from the state selected.

In these conditions, it is possible, after the processing of L1 successive segments of the observation signal up to a segment n and the selection of a state, to estimate Q×L1 symbols $D_m$ relative to the previous L1 segments n−r such as n−L0−L1<n−r≦n−L0, and to determine the respective likelihoods of the estimations of these Q×L1 symbols $D_m$, the estimations of Q symbols relative to a previous segment n−r being formed respectively by the values of the Q-uplet of symbols with which is associated the (r+1)-th surviving branch of the optimal path covered by returning from the selected state.

The parameters L0 and L1 are chosen according to the compromise being sought between the storage space needed to run the process and the amount of calculation to be made.

To advantage, once a state $E_{e0}$ has been selected after the processing of L1 successive segments of the observation signal up to a segment n, state notes $X_e$ relative to the NE states $E_e$ ($0 \leq e < NE$) are initialised according to $X_e = |MEA_e(n) - MEA_{e0}(n)|$, then the following operations are performed for each value of the integer r ranging from 0 to L0+L1−1:

- the selection of the surviving branch $B_{b0}$ stored, for the selected state $E_{eO}$, during the processing of the segment n−r, followed by the updating of the selected state $E_{e0}$ taken as being the start state of the surviving branch selected $B_{b0}$;
- for each of the NB branches $B_b$ ($0 \leq b < NB$), the calculation of a branch node $Z_b$ by adding to the state node $X_e$ relative to the arrival state $E_e$ of the branch $B_b$ the difference in metrics $\delta_b(n-r)$ stored for the branch $B_b$;
- for each of the NE states $E_e$ ($0 \leq e < NE$), the updating of the state node $X_e$, taken as equal to the smallest of the branch nodes $Z_b$ calculated for those of the branches $B_b$ which have the state $E_e$ as the start state;
- if $r \geq L0$, the estimation of Q symbols of the sequence to be detected, by the values of the Q-uplet of symbols with which the surviving branch selected $B_{b0}$ is associated; and
- if $r \geq L0$, for each estimation di accepted for one of the Q symbols $D_m$, the determination of the minimum difference in metrics as being the smallest of the branch nodes $Z_b$ calculated for those of the branches $B_b$ which are associated with Q-uplets the symbol of which corresponding to the symbol $D_m$ has a value di different from the estimation $d^i$.

Another aspect of the present invention relates to a Viterbi processor, including elementary metrics calculation means and sequential processing means adapted to the implementation of the method above. Such a Viterbi processor may particularly be part of a digital signal demodulator, or else of a decoder such as an error correcting decoder.

DESCRIPTION OF PREFERRED EMBODIMENTS

A Markov process, modelling the production of an observation signal R from a discrete symbol sequence $D_0, D_1, \ldots, D_m$, etc. may be described by a trellis having NE states $E_e$ ($0 \leq e < NE$) and NB elementary branches $B_b$ ($0 \leq b < NB$). Each discrete symbol in the sequence may assume a number ND of different values $d^0, d^1, \ldots, d^{ND-1}$. Each branch $B_b$ has a start state $E_{P(b)}$ and an arrival state $E_{S(b)}$ ($0 \leq P(b) < NE$, $0 \leq S(b) < NE$), and is associated with a single Q-uplet of discrete symbols $d^{idec(b,0)}, \ldots, d^{idec(b,Q-1)}$, Q being an integer at least equal to 1. To each pair formed by a state $E_e$ and a Q-uplet of symbols corresponds a single branch $B_b$ associated with this Q-uplet and having the state $E_e$ as the start state (e=P(b)).

Figure 1:
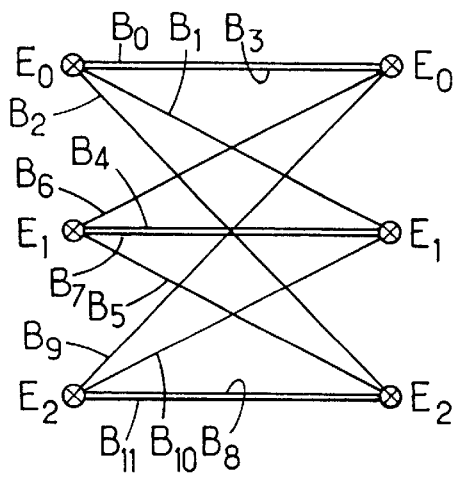
FIGS. 1 and 2 are diagrams of an example of a demodulation trellis and of an example of an error correcting decoding trellis.

By way of illustration, FIG. 1 shows such a trellis with NE=3 states and NB=12 branches, in which the index of the start state $E_{P(b)}$ of a branch $B_b$ is the quotient of the Euclidean division of b by 4 (P(b)=b div 4), and the index of the arrival state $E_{S(b)}$ of a branch $B_b$ is the remainder of the Euclidean division of b by 3 (S(b)=b mod 3). Each branch $B_b$ is associated with two bits which correspond for example to the remainder of the Euclidean division of b by 4 (b mod 4). In this example, the symbols may be either quaternary (Q=1, ND=4, with idec(b,0)=b mod 4), or binary (ND=2, Q=2, with idec(b,q)=bit weighted by $2^q$ in the binary representation of b mod 4).

Figure 2:
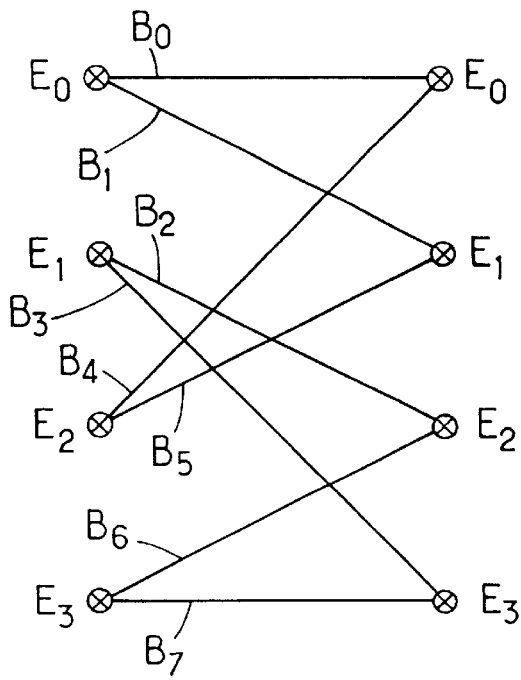

FIG. 2 shows another example of trellis with NE=4 states and NB=8 branches, in which P(b)=b div 2, and S(b)=b mod 4. In this example. the symbols are binary (ND=2, Q=1, with idec(b,0)=b mod 2).

A trellis of this type is considered developed over L stages relative to L successive time segments n of the observation signal R ($0 \leq n < L$). corresponding to L×Q symbols of the sequence to be detected. The successive segments of the observation signal possibly have overlaps. Each path in the trellis, which consists of a succession of branches $B_{b(0)}, B_{b(1)}, \ldots, B_{b(L-1)}$ such that S[b(n−1)]=P[b(n)] for 0<n<L−1, is associated with a single possible sequence of L×Q symbols consisting of.the succession of Q-uplets with which the branches $B_{b(0)}, B_{b(1)}, \ldots, B_{b(L-1)}$ are respectively associated.

The trellis describes the production of the observation signal in the sense that the law of probability of a segment n of the observation signal is determined by the branch $B_{b(n)}$ followed in the trellis at the corresponding stage n, or in other words by the start state $E_{P[b(n)]}$ which retains some memory of previous symbols and by the Q-uplet of symbols with which the branch $B_{b(n)}$ is associated. Detection according to maximum likelihood thus consists in identifying the optimal path in the trellis, i.e. the succession of branches which maximises the probability of occurrence of the collected observation signal. The estimated symbols are then extracted from the sequence with which this optimal path is associated.

The identification of the optimal path amounts to a maximisation (or to a minimisation according to the conventions employed) of a metric accumulated along the path, equal to a sum of elementary metrics calculated for the successive branches forming the path, the elementary metrics explaining the probabilistic dependence between the segments of the observation signal and the branches.

Let us denote by M(α) the metric of a path α of the trellis developed over L stages, by $CB_b(n)$ the set of paths of the trellis which follow the branch $B_b$ at stage n, by $$CE_e(n) = \bigcup_{\substack{0 \leq b < NB \\ S(b)=e}} CB_b(n)$$

the set of paths of the trellis which reach state $E_e$ at stage n, and by $MEA_e(n, \alpha)$ the metric of a path a of $CE_e(n)$ accumulated up to stage n only.

The case is considered below where the elementary metric $MB_b(n)$ calculated for the branch $B_b$ at stage n is the scalar product $Re(<s_b|r_n>)$ between the segment n of the observation signal R (segment formed of real or complex samples denoted $r_n$) and a real or complex reference signal $s_b$ associated with the branch $B_b$, the reference signals $s_b$ being established so that optimisation of the metric is a maximisation (it would be a minimisation if, with the same reference signals $s_b$, the elementary metric employed was the square of the Euclidean distance between the segment $r_n$ and the reference signal $s_b$, i.e. $\|r_n-s_b\|^2$).

The Viterbi algorithm takes advantage of the fact that the "best" path of the set $CE_e(n)$, i.e. the one which optimises (maximises in the case under consideration) the total metrics $M(\alpha)$ over the L stages, optimises also the metrics $MEA_e(n, \alpha)$. As a result, at each stage n (n ranging from 0 to L−1), only the accumulated metrics for each state $E_e$ have to be stored:

$$MEA_e(n) = \max_{\alpha \in CE_e(n)} [MEA_e(n, \alpha)] = \max_{\substack{0 \leq b < NB \\ S(b)=e}} [MBA_b(n)] \quad (1)$$

as well as the index $surv_e(n)$ of the branch, called the surviving branch, having the state $E_e$ as arrival state and for which the accumulated branch metrics, defined by $MBA_b(n) = MEA_{P(b)}(n-1) + MB_b(n)$, is optimal:

$$surv_e(n) = \underset{\substack{0 \leq b < NB \\ S(b)=e}}{\operatorname{argmax}} [MBA_b(n)] \quad (2)$$

At the end of the L stages, the Viterbi algorithm selects one of the NE states, and builds the optimal path by returning up the surviving branches from this selected state.

The selected state may be the one for which the accumulated state metric $MEA_e(L-1)$ is optimal if no condition is imposed on limits. It may again be a predetermined state if the sequence ends with known symbols. Similarly, the initialisation of the algorithm, by the values of the metrics $MEA_e(-1)$, depends on the available prior knowledge of the beginning of the sequence to be detected.

The designation $MX_e(n)$ is now given to the "best" of the total metrics of the paths reaching the state $E_e$ at the stage n, and $MZ_b(n)$ to the "best" of the total metrics of the paths passing through the branch $B_b$ at the stage n:

$$MX_e(n) = \max_{\alpha \in CE_e(n)} [M(\alpha)] = \max_{\substack{0 \leq b < NB \\ S(b)=e}} [MZ_b(n)] \quad (3)$$

$$MZ_b(n) = \max_{\alpha \in CB_b(n)} [M(\alpha)] \quad (4)$$

Lastly, $$CD_q^i(n) = \bigcup_{\substack{0 \leq b < NB \\ idec(b,q)=i}} CB_b(n)$$

will designate the set of paths in the trellis which are associated with sequences whose symbol $D_m$ of position $m=nQ+q$ takes the value $d^i$ ($0 \leq i < ND$, $0 \leq q < Q$, $0 \leq n < L$), and $MD_q^i(n)$ will designate the "best" of the total metrics of the paths of the set $CD_q^i(n)$:

$$MD_q^i(n) = \max_{\alpha \in CD_q^i(n)} [M(\alpha)] = \max_{\substack{0 \leq b < NB \\ idec(b,q)=i}} [MZ_b(n)] \quad (5)$$

The traditional Viterbi algorithm does not calculate the quantities $MX_e(n)$, $MZ_b(n)$ and $MD_q^i(n)$. Nonetheless, at each of the stages n, the optimal path $\alpha_{opt}$ which it determines passes through the branch $B_{b0(n)}$ which optimises the quantity $MZ_b(n)$, and reaches the state $E_{e0(n)}$ which optimises the quantity $MX_e(n)$:

$$b0(n) = \underset{0 \leq b < NB}{\operatorname{argmax}} [MZ_b(n)] \quad (6)$$

$$e0(n) = \underset{0 \leq e < NE}{\operatorname{argmax}} [MX_e(n)] \quad (7)$$

The likelihood of the estimation $d^i$ of a symbol $D_m = D_{nQ+q}$ obtained by the Viterbi algorithm is proportional to the log-ratio of conditional probabilities:

$$LLR_m^i = \ln\left(\frac{\Pr(D_m = d^i|R)}{\Pr(D_m \neq d^i|R)}\right) \quad (8)$$

i.e.: $$LLR_m^i = \ln\left(\frac{\sum_{\alpha \in CD_q^i(n)} \exp(2M(\alpha)/\sigma^2)}{\sum_{\substack{j=0 \\ j \neq i}}^{ND-1} \sum_{\alpha \in CD_q^j(n)} \exp(2M(\alpha)/\sigma^2)}\right)$$

where $\sigma^2$ is the variance of the noise contained in the observation signal.

If we approximate the sums of exponential quantities by the largest of the exponential quantities, approximations compensate each other to a great extent in the numerator and in the denominator, the expression (8) becomes:

$$LLR_m^i \approx \ln\left(\frac{\exp(2M(\alpha_{opt})/\sigma^2)}{\sum_{\substack{j=0 \\ j \neq i}}^{ND-1} \exp(2MD_q^j(n)/\sigma^2)}\right) \quad (9)$$

If the estimated symbols are binary (ND=2), it is then possible to take as the likelihood of the estimation $d^i$ of the symbol $D_m$ the quantity:

$$\Lambda_m = |M(\alpha_{opt}) - MD_q^{i'}(n)| \quad (10)$$

$$= M(\alpha_{opt}) - MD_q^{i'}(n) \approx \left(\frac{\sigma^2}{2}\right) \cdot LLR_m^i \quad (11)$$

or a quantity proportional thereto, $d^{i'}$ being the decision different from the retained estimation $d^i$. The likelihood may also be evaluated according to equation (10) in a non-binary case (ND>2), $d^{i'}$ then being the "best" decision different from the retained estimation $d^i$:

$$i' = \underset{\substack{0 \leq j < ND \\ j \neq i}}{\operatorname{argmax}} [MD_q^j(n)] \quad (12)$$

The optimal metric $M(\alpha_{opt})$ is calculated by the traditional Viterbi algorithm, but not the metric $MD_q^{i'}(n)$ of the competitor path.

To access the metric $MD_q^{i'}(n)$ of the competitor path, it is possible to make a recursive calculation of the quantities $MX_e(n)$ et $MZ_b(n)$, in the following way:

at each stage n of the direct tracking in the trellis, storing for each branch $B_b$ ($0 \leq b < NB$) the difference in metrics $\delta_b(n) = |MBA_b(n) - MEA_{S(b)}(n)| = MEA_{S(b)}(n) - MBA_b(n)$;

after having selected a state e0 at stage n, obtaining the metrics $MX_e(n) = MEA_e(n)$ for $0 \leq e < NE$;

at each stage n−r of the backtracking in the trellis (r=0, 1, etc.), performed after the selection of a state at stage n, calculating for each branch $B_b$ ($0 \leq b < NB$) the metric $MZ_b(n-r) + MX_{S(b)}(n-r) + \delta_b(n-r)$, and then, for $0 \leq e < NE$, calculating:

$$MX_e(n-r-1) = \max_{\substack{0 \leq b < NB \\ P(b)=e}} MZ_b(n-r) \quad (13)$$

In this way, metrics $MZ_b(n)$ defined in equation (4) are available. simply by having stored the differences $\delta_b(n)$ (or quantities enabling them to be easily retrieved) and by having gone through a limited number of uncomplicated processes (additions/subtractions, comparisons). From the metrics $MZ_b(n)$, it is easy to deduce the metrics $MD_q^i(n)$ according to equation (5), to identify the metrics $MD_q^{i'}(n)$ of the competitor paths for each estimated symbol, and therefore to provide a good measurement of the likelihoods.

If, in a non-binary case (ND>2), it turns out that competitor paths leading to different decisions $d^{i'} \neq d^{i''}$ have metrics close to each other, i.e. $MD_q^{i'}(n) \approx MD_q^{i''}(n) < MD_q^i(n) = M(\alpha_{opt})$, one option is to improve the approximation of the likelihood relative to expression (10) by subtracting a corrective term. In the worst case, where the optimal metrics relative to all the possible decisions are equal ($MD_q^{i'}(n) = MD_q^{i''}(n)$ $\forall i', i'' \neq i$), the smallest difference in metrics $M(\alpha_{opt}) - MD_q^{i'}(n)$ becomes, according to equation (9):

$$M(\alpha_{opt}) - MD_q^{i'}(n) \approx \left(\frac{\sigma^2}{2}\right) \cdot [LLR_m^i + \ln(ND-1)] \quad (14)$$

The corrective term may be proportional to $\sigma^2$ (which must then be estimated), with a multiplier coefficient which decreases from $(\frac{1}{2}).\ln(ND-1)$ to 0 with the dispersion of the metrics of competitor paths.

If the implementation of the Viterbi algorithm is based on an elementary metric to be minimised, such as the square of the Euclidean distance, it goes without saying that the maxima of equations (1) to (7), (12) and (13) must be replaced by minima, the differences in metrics $\delta_b(n)$ being equal to $MBA_b(n) - MEA_{S(b)}(n)$, and the likelihood $\Lambda_m$ according to equation (10) becoming:

$$\Lambda_m = MD_q^{i'}(n) - M(\alpha_{opt}) \approx \sigma^2 . LLR_m^i \quad (15)$$

Figure 3A:
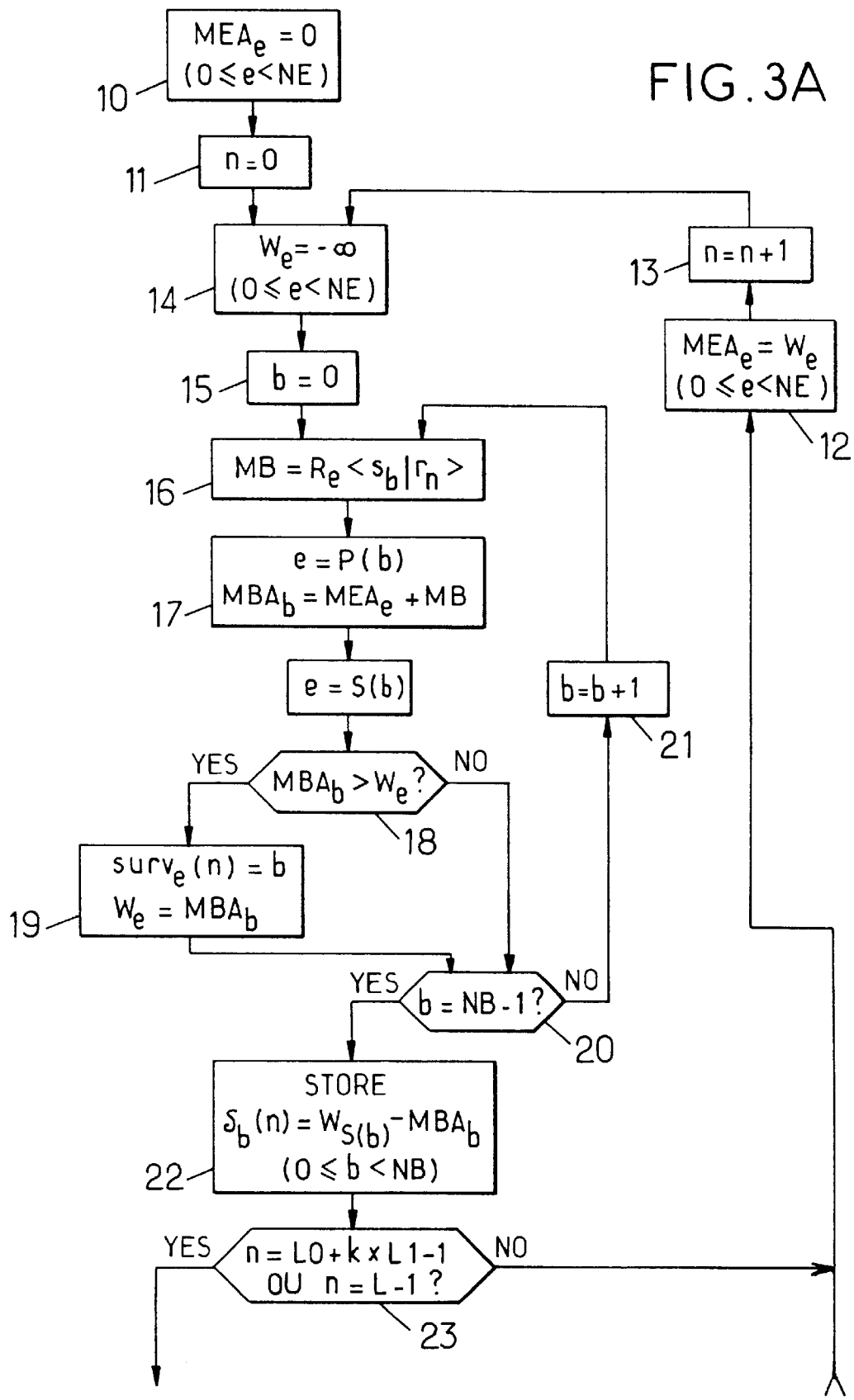
FIG. 3, constituted by placing FIGS. 3A, 3B and 3C above each other, is a flowchart of a detection method according to the invention.
Figure 3B:
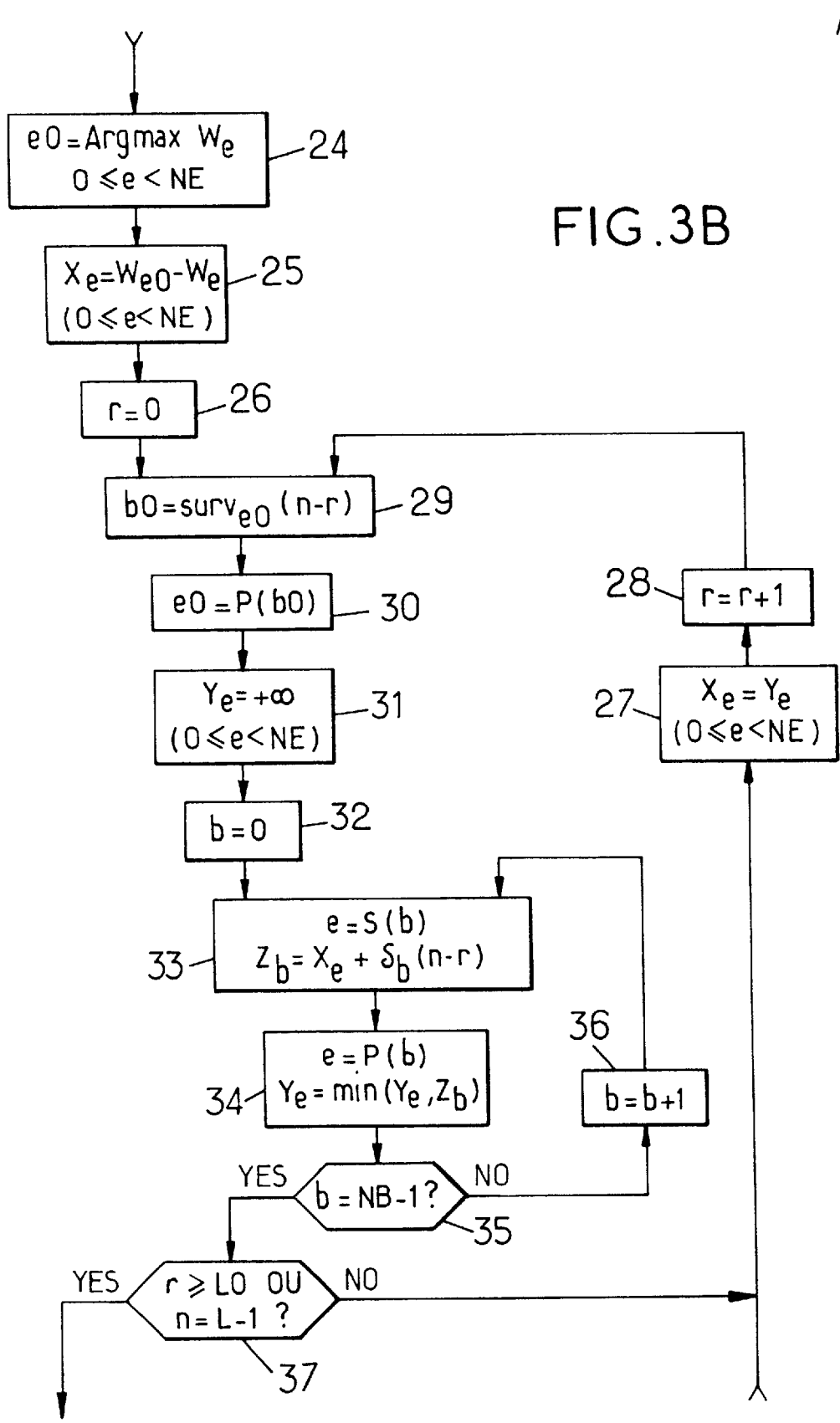

FIG. 3 shows an example of a version of a method according to the invention, in which, in order to further cut down the calculations, it is not the metrics $MX_e(n)$, $MZ_b(n)$ (equations (3) and (4)) which are calculated explicitly, but the differences between the metric $M(\alpha_{opt})$ of the optimal path determined according to the Viterbi algorithm and these metrics $MX_e(n)$, $MZ_b(n)$.

The method shown in FIG. 3 comprises, for the direct tracking in the trellis, a main loop on the index n of the segments of the observation signal received. Backtracking is performed in the trellis every L1 iterations in this loop, the first backtracking being performed at the conclusion of the L0+L1 first iterations. The integer parameters L0 and L1 are selected such that $1 \leq L1 < L$ and $0 \leq L0 \leq L-L1$. During the backtracking performed at the conclusion of the L0+k×L1 first iterations (k≥1), the estimations of the symbols $D_{Q.(k-1).L1}$ to $D_{Q.k.L1-1}$ and the corresponding likelihoods are calculated.

The differences in metrics $\delta_b(n)$ and the surviving branches $surv_e(n)$ are stored during L0+L1 consecutive iterations in the loop so as to be available for each backtracking. The other magnitudes calculated can only be stored during the current iteration (as a result, the reference to n is abandoned in the notations employed in FIG. 3 for these magnitudes).

The number L0+L1 therefore determines the size of the memory required for the calculation of likelihoods. Generally, L0 may be equal to the truncation depth (denoted $\delta$ in the aforementioned article by G. D. Forney) from which it is very probable that all surviving paths have merged. A high L1 value leads to a relatively large memory size, but reduces the calculations to be made. In the limit case where L1=L (L0=0), backtracking is performed only once, requiring the differences in metrics $\delta_b(n)$ to be backed up on the whole length L of the trellis. Conversely, a low L1 value limits the memory size, but requires more calculations. In the limit case where L1=1, backtracking of depth L0+1 is performed at each iteration from n=L0, in order to estimate only Q symbols at the same time.

In the iteration n of the main loop, $MEA_e$ ($0 \leq e < NE$) represents the accumulated state metric $MEA_e(n-1)$ up to the stage n−1, and $W_e$ represents the accumulated state metric $MEA_e(n)$ calculated during stage n. Before starting a new iteration (initialisation 11 by n=0, or incrementation of the index n at stage 13), the accumulated state metrics $MEA_e$ are updated at stage 10 or 12. At stage 12, the updating consists simply in taking $MEA_e = W_e$ for $0 \leq e < NE$. At stage 10, the values $MEA_e(-1)$ relative to the initial conditions are adopted. In the example shown in FIG. 3A, there is no prior knowledge of the start state, with the result that the metrics $MEA_e$ are all initialised at the same value (0) at stage 10. If the start state is known (for example because the sequence to be detected is preceded by a known synchronisation sequence), an initial zero metric can be assigned to this known state and arbitrarily low metrics (−∞) to the other states.

In each iteration n, the first thing is to give the variables $W_e$ arbitrarily low values (−∞), and to initialise at 0 the branch b index (stages 14 and 15). For each value of b, the elementary metric $MB = MB_b(n)$ is calculated at stage 16, in the example under consideration by the scalar product between the segment $r_n$ of the observation signal and the reference signal $s_b$ associated with the branch $B_b$. At stage 17, the accumulated branch metric $MBA_b = MBA_b(n)$ is calculated by adding the elementary metric MB to the accumulated state metric $MEA_{P(b)}$ relative to the start state of the branch $B_b$. At stage 18, the previously calculated accumulated branch metric $MBA_b$ is compared with the variable $W_{S(b)}$. The values $surv_{S(b)}(n) = b$ and $W_{S(b)} = MBA_b$ are taken at stage 19 only if $MBA_b > W_e$. Next, the branch index b is compared with the number of branches NB at stage 20. If b<NB−1, the index b is incremented by one unit at stage 21, before returning to stage 16 for the processing of the following branch.

When b=NB−1 at stage 20, the new accumulated state metrics are contained in the variables $W_e$, and the surviving branches in the variables $surv_e(n)$ which are stored. The following operation 22 is the storage of the differences in metrics $\delta_b(n) = W_{S(b)} - MBA_b$ for each of the branches $B_b$ ($0 \leq b < NB$).

If n<L−1 and if n does not have the form L0+k×L1−1, with k an integer higher than or equal to 1 (test 23), the iteration n in the main loop ends with the return to stages to 12 and 13.

Backtracking is performed in the trellis when the test 23 shows that n=L0+k×L1−1 (or that n=L−1).

This backtracking starts at stage 24 (FIG. 3B) with the selection of a state $E_{e0}$.

If there is no prior knowledge as to the final state, the selected state $E_{e0}$ is the one for which the state metric $W_{e0}$, accumulated up to the iteration n of the main loop, is maximum. At stage 25, state nodes $X_e$ are respectively taken as equal to the differences $W_{e0}-W_e$ for $0 \leq e < NE$, i.e. $X_e=M(\alpha_{opt})-MX_e(n)$. If the state at the end of the sequence is known (for example because the sequence to be detected is followed by a known synchronisation sequence), it is then this known state $E_{e0}$ which is selected at stage 24 during the final iteration n=L−1, a zero state note being then assigned to this state $E_{e0}$ at stage 25, and arbitrarily large state nodes being assigned to the other states (which amounts to assuming $X_e=M(\alpha_{opt})-MX_e(n)$ if arbitrarily small elementary metrics are assigned to the branches leading to a state other than $E_{e0}$ at the end of the sequence).

Backtracking in the trellis comprises a second loop, indexed by an integer r rising from 0 to L0+L1−1. In each iteration r of this second loop, a branch note $Z_b$ is calculated equal to $M(\alpha_{opt})-MZ_b(n-r)$ for each branch $B_b$ ($0 \leq b < NB$), and, if r<L0+L1−1, new state nodes $Y_e$ are calculated respectively equal to $M(\alpha_{opt})-MX_e(n-r-1)$ for the following iteration ($0 \leq e < NE$).

In the iteration r of this second loop, which relates to the iteration n−r of the main loop, the quantity $X_e$ denodes the state note $E_e$ calculated at iteration r−1 (or initialised at stage 25 if r=0), equal to $M(\alpha_{opt})-MX_e(n-r)$. Before starting a new iteration in this second loop (initialisation 26 by r=0, or incrementation of the index r at stage 28), the state nodes $X_e$ are updated at stage 25 or 27. At stage 27, the updating consists simply in assuming $X_e=Y_e$.

In each iteration r of the backtracking loop, the first thing is to select the surviving branch $B_{b0}$ stored for the selected state $E_{e0}$, then to select a new state $E_{e0}$ corresponding to the start state $E_{P(b0)}$ of the surviving branch selected (stages 29 and 30). Arbitrarily high values (+∞) are attributed to the variables $Y_e$ ($0 \leq e < NE$), then the branch b index is initialised at 0 (stages 31 25 and 32). For each value of b, the branch note $Z_b$ is calculated at stage 33 by reading in the memory the value of the difference in metrics $\delta_b(n-r)$, and by adding the read value to the note $X_{S(b)}$ of the arrival state of the branch $B_b$. At stage 34, the variable $Y_{P(b)}$ is taken as equal to the branch note $Z_b$ if $Z_b$ is less than the previous value of this variable $Y_{P(b)}$, and otherwise kept unchanged. The branch index b is then compared with the number of branches NB in the trellis at stage 35. If b<NB−1, the branch index b is incremented at stage 36 before returning to stage 33 for the calculation of the next branch note. When b=NB−1 at stage 35, the calculation of the branch nodes $Z_b$ and of the new state nodes $Y_e$ is ended. If r<L0 and n<L−1 (test 37), the iteration r in the backtracking loop ends with the return to stages 27 and 28.

Figure 3C:
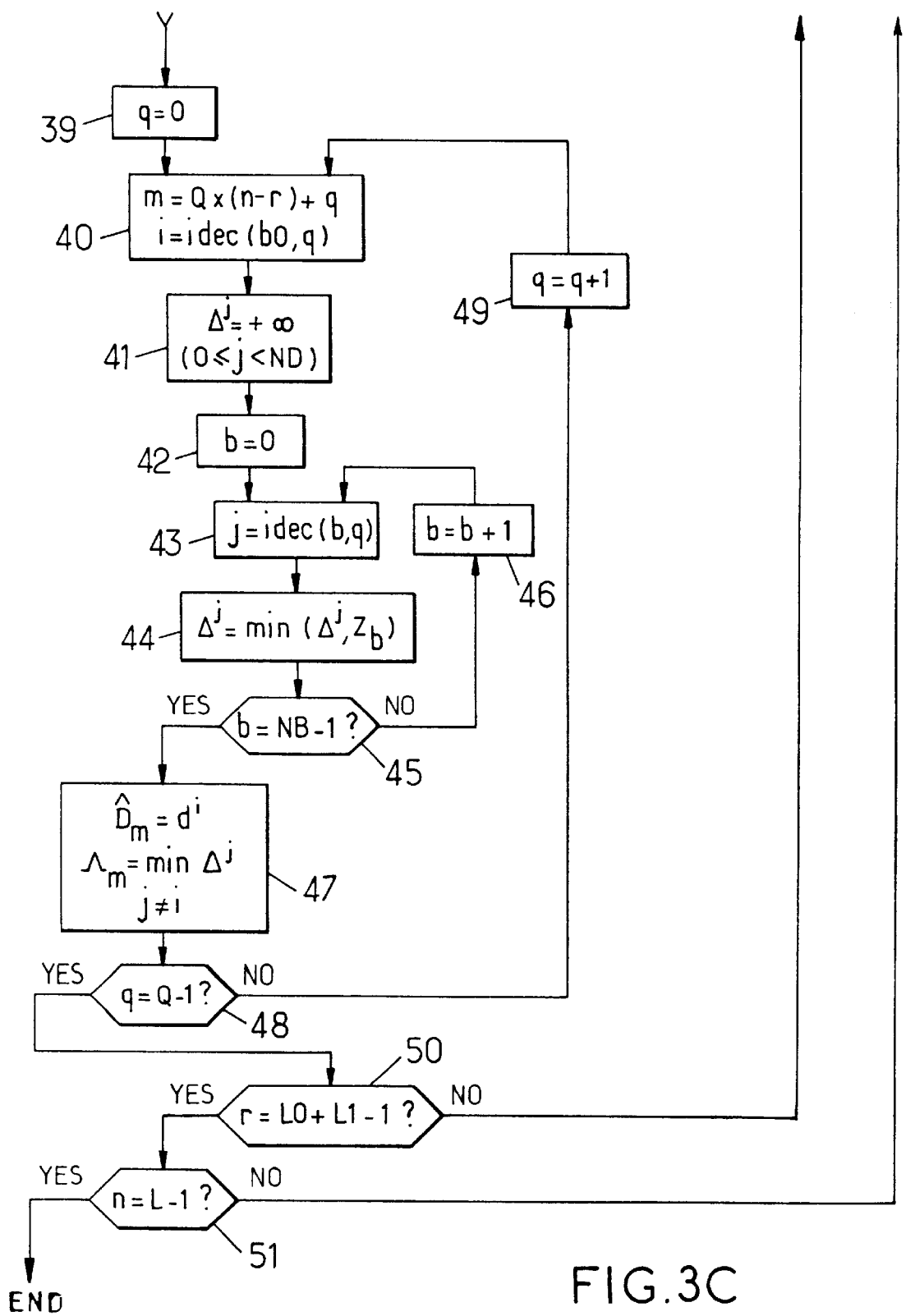

Otherwise (r≧L0 ou n=L−1), estimations of the symbols of ranks m=Q×(n−r) to m=Q×(n−r+1)−1, and the corresponding likelihood calculations are started, as shown in FIG. 3C.

For each of the Q symbols to be estimated, located by the index q ($0 \leq q < Q$, q being initialised at 0 at stage 39), the position m=Q×(n−r)+q is determined at stage 40, as is the index i of the estimated value $d^i$ of the symbol $D_m$, given by i=idec(b0,q), b0 being the index of the surviving branch selected at the previous stage 29. A decision note $\Delta^j$ is initialised at an arbitrarily high value (+∞) for each of the possible decisions $d^j$ ($0 \leq j < ND$), then the branch index b is initialised at 0 (stages 41 and 42). For each value of b, such that the branch $B_b$ leads to a decision $d^j$ for the symbol of rank q (stage 43), the branch note $Z_b$ is compared with the variable $\Delta^j$ at stage 44. The variable $\Delta^j$ is updated with the branch note $Z_b$ if this note $Z_b$ is less than the previous value of this variable $\Delta^j$, and kept unchanged otherwise. At stage 45, the branch index b is compared with the number of branches NB of the trellis: if b<NB−1, the branch index b is incremented at stage 46 before returning to stage 43 for the processing of the next branch. When b=NB−1 at stage 45, the calculation of the decision nodes $\Delta^j$ is ended, and we have $\Delta^i=0$ and, for j≈i, $\Delta^j=M(\alpha_{opt})-MD_q^j(n-r)$.

The detector can then deliver, at stage 47, the estimation $\hat{D}_m=d^i$ of the symbol $D_m$, and the associated likelihood $\Lambda_m$, equal to the smallest of the decision nodes $\Delta^j$ for j≈i. This likelihood $\Lambda_m$ corresponds to the minimum difference in metrics between the optimal path $\alpha_{opt}$ and the "best" competitor path relative to the symbol $D_m$, as defined in equation (10).

So long as all the symbols relative to the iteration r of the backtracking have not been estimated (q<Q−1 during the test 48), the index q is incremented at stage 49 before returning to stage 40. When q=Q−1 in test 48, the index r is compared with the backtracking depth (test 50). If r<L0+L1−1, the iteration r in the backtracking loop ends with the return to stages 27 and 28.

When r=L0+L1−1, the index n of the iteration in the main loop is compared with the length L of the sequence at stage 51. If n<L−1, the iteration n ends with the return to stages 12 and 13. The estimation procedure of the symbols in the sequence is completed when n=L−1 at stage 51.

It will be noted that the estimation procedure shown in FIG. 3 lends itself well to different programming tricks enabling its operation to be simplified or accelerated. For example, the processings 16–19, 33–34 and 4344 carried out for the different branches $B_b$ of the trellis may be carried out totally or partially in parallel. On the other hand, the regularity of the structure of many usable trellises (as for example those in FIGS. 1 and 2) may enable the procedure to be simplified in many cases.

Advantageously, the differences in metrics $\delta_b(n)$, whose storage is required, are stored in a memory unit organised in last-in-first-out mode (LIFO). This enables the addressing mechanism in this memory unit to be largely simplified, or even removed, by the calculation organisation. Indeed, it is worth noting that the differences in metrics $\delta_b(n)$ are read in the memory at stages 33 in the reverse order from that in which they were written at stages 22. The same is true for the identifications $surv_e(n)$ of the surviving branches.

Figure 4:
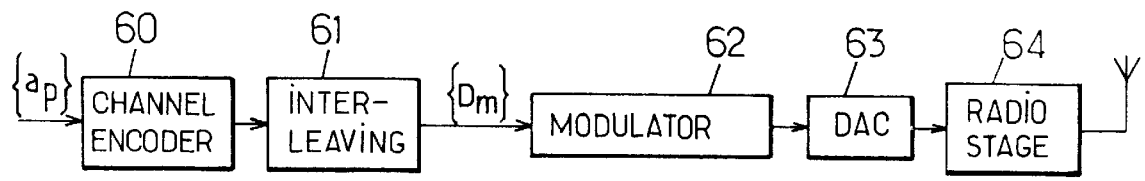
FIGS. 4 and 5 are block diagrams of a radio-communication transmitter, and of a corresponding receiver implementing the invention.
Figure 5:
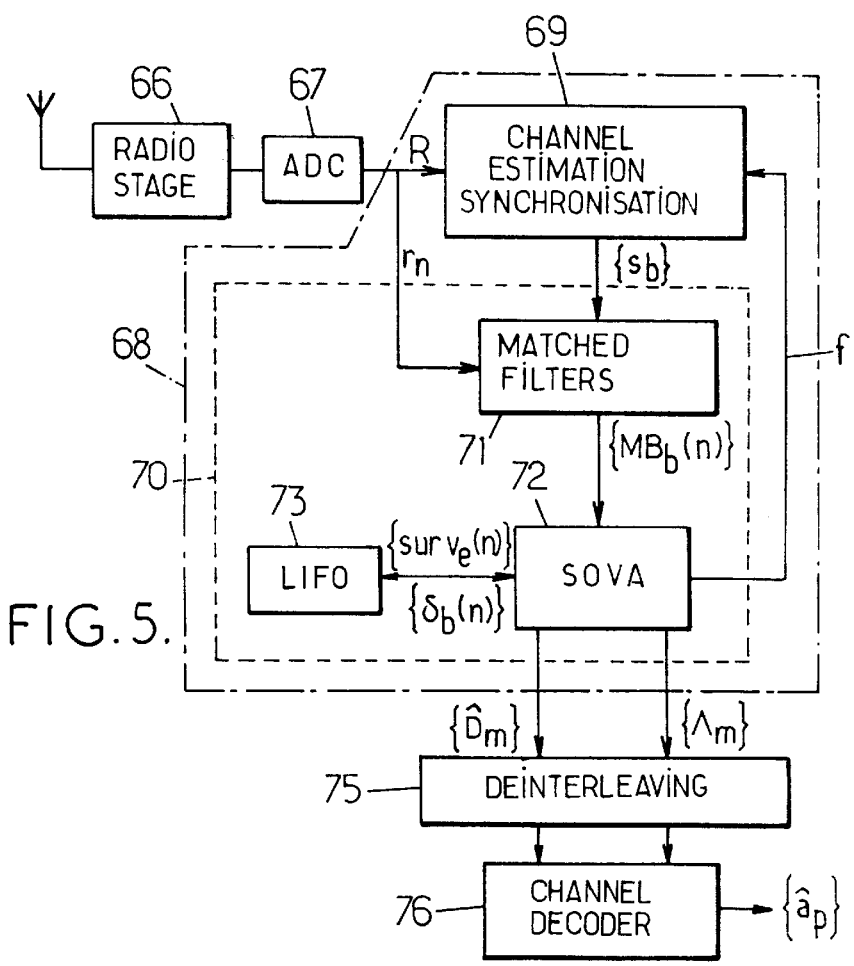

FIGS. 4 and 5 show the implementation of the invention in a digital signal demodulator.

FIG. 4 shows diagrammatically a radio-communication transmitter having to transmit digital symbol $a_p$. A channel encoder 60 processes the digital stream $\{a_p\}$ according to a redundancy code the properties of which allow the detection and/or the correction of transmission errors. A unit 61 conventionally carries out an interleaving of the symbols delivered by the encoder 60 so as to improve the performance of the correcting code in the presence of transmission errors arising in bursts. The modulator 62 receives the symbols $D_m$ from the interleaving unit 61, as well as a predefined synchronisation sequence. In this way are formed successive digital signal frames each including one or several synchronisation sequences and one or several sequences of information symbols $D_m$.

By way of example. the modulator 62 may apply to the signal frames a quaternary continuous phase modulation (CPM) with a modulation index h=⅓, with a phase pulse equal in length to four symbol times. Such a modulation may be described by a trellis such as the one shown in FIG. 1, when the phase pulse is modelled as limited to its central symbol time in the design of the receiver (see B. E. RIMOLDI, "A Decomposition Approach to CPM", IEEE Trans. on Information Theory, Vol.34, No.2, March 1988, pages 260–270).

The output signal of the modulator 62 is converted to analog in 63, then to a radio signal by a stage 64. The radio signal thus transmitted is picked up by a receiver such as the one shown in FIG. 5, after following a propagation channel.

The receiver in FIG. 5 comprises a radio stage 66 which restores, after adequate filterings, a baseband signal, digitised by a converter 67. The baseband digital signal is a complex signal provided to the demodulator 68, which includes on the one hand a unit 69 of synchronisation and channel estimation, and on the other hand a Viterbi processor 70.

On the basis of the synchronisation sequences introduced by the transmitter into the signal frames, the unit 69 provides to the processor 70 the synchronisation data which enables it to locate the segments $r_n$ of the baseband digital signal forming the observation signal R used in the method according to the invention. The unit 69 also carries out a channel response estimation so as to deliver the reference signals $s_b$ used in the implementation of the Viterbi algorithm. In the absence of inter-symbol interference, the unit 69 simply estimates a complex number representing the attenuation and the phase introduced by the channel, and multiplies it by predefined pulses to provide reference signals $s_b$. If account is taken of an inter-symbol interference, it is an impulse response of the channel which is estimated by the unit 69 and convoluted with the predefined pulses to form reference signals $s_b$.

The Viterbi processor 70 calculates the estimations $\hat{D}_m$ of the symbols $D_m$ provided to the modulator 62 from the transmitter, and the corresponding likelihoods $\Lambda_m$ according to the method disclosed above. The metrics of elementary branches $MB_b(n)$, calculated according to the scalar product convention, may be produced by a matched filter bank 71 of the processor 70, receiving the baseband signal R and having coefficients defined by the reference signals $s_b$. The processor 70 additionally includes a sequential processing unit 72 which performs the calculations according to the above-described soft output Viterbi algorithm (SOVA), and a memory unit 73 of the LIFO type, in which the SOVA unit 72 writes and reads the differences in metrics $\delta_b(n)$ and the indications $surv_e(n)$ of the surviving branches.

With the CPM modulation under consideration, the method is run with ND=4, Q=1 if the channel encoder 60 delivers quaternary symbols, and with ND=2, Q=2 if the output symbols of the encoder channel 60 are bits.

As symbolised by the arrow f in FIG. 5, the symbols estimated by the SOVA unit 72 can be provided as feedback to the channel estimation unit 69, in the case where propagation channel variability requires it to be estimated in an adaptive way.

At the output of demodulator 68, a de-interleaving unit 75 operates the permutation of symbols opposite to that performed by the interleaving unit 61 of the transmitter, and delivers the soft estimations of the de-interleaved symbols to the channel decoder 76, which is dual of the encoder 60. The fact that this decoder 76 has soft inputs enables an appreciable saving to be made in terms of error rates in the estimations $\hat{a}_p$ of the symbols $a_p$ transmitted by the transmitter. The decoder 76 may have hard outputs. It may also have soft outputs (in this case, it may particularly implement the invention) if some likelihood data is useful in the subsequent processing of decoded symbols.

Figure 6:
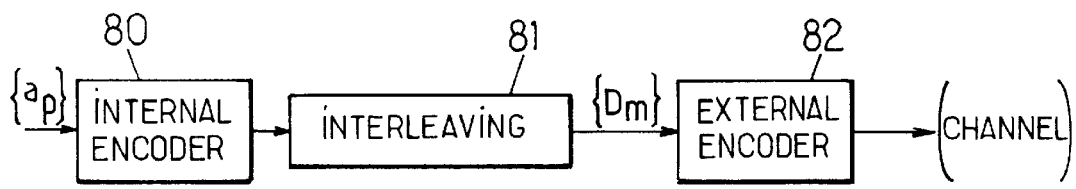
FIGS. 6 and 7 are block diagrams of a digital signal transmitter, and of a corresponding receiver implementing the invention.
Figure 7:
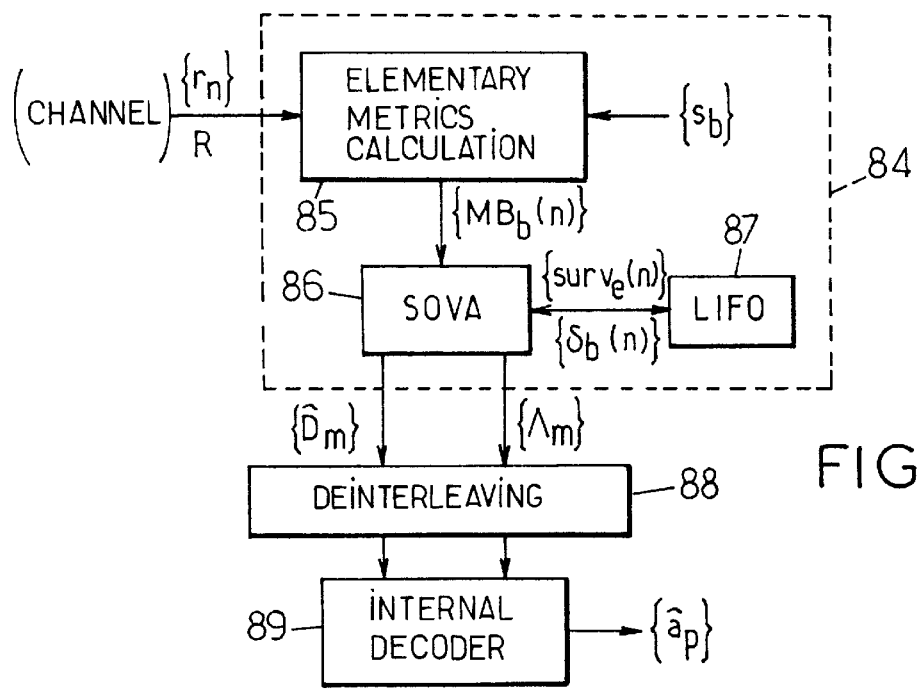

FIGS. 6 and 7 show another application of the invention in a digital transmission chain.

FIG. 6 shows a digital signal transmitter comprising two encoding stages. A first encoder 80, or "internal encoder", receives the symbols $a_p$ to be transmitted. After interleaving by a unit 81, the symbols $D_m$ delivered by the internal encoder 80 are provided to a second encoder 82, or "external encoder". The symbol stream delivered by the external encoder 82 is sent on a transmission channel which may be of any type (it may particularly include a modulator, a propagation channel and a demodulator, for example as described by reference to FIGS. 4 and 5 it may also include a memory in which the data transmitted would be stored for a certain time).

The external encoder 82 processes the digital stream $\{D_m\}$ according to a redundancy code the properties of which allow the detection and/or the correction of transmission errors. The internal encoder 80 may also be a redundancy encoder (both stages 80, 82 then apply a product code, or turbocode).

By way of illustration, the external encoder 82 may operate according to a convolutional code, which it is common practice to decode using the Viterbi algorithm. It is for example the convolutional code CC(2,1,3), with a yield of ½ and a constraint length of 3, in which case the decoding trellis may be that shown in FIG. 2.

The receiver shown in FIG. 7 receives from the transmission channel the observation signal R distributed in successive overlapping segments $r_n$. In the above example of the convolutional code CC(2,1,3), each segment $r_n$ covers six bits of the transmitted signal. If the transmission channel ends with a demodulator such as the demodulator 68 in FIG. 5, each sample of the observation signal R corresponds to a real value the sign of which represents the estimation of one output bit of the external encoder 82 and the absolute value of which corresponds to the associated likelihood.

The external decoder 84 of the receiver in FIG. 7 includes a unit 85 for calculating the elementary metrics $MB_b(n)$, a SOVA sequential processing unit 86 and a memory unit 87 of the LIFO type to contain the differences in metrics $\delta_b(n)$ and the indications $surv_e(n)$ of the surviving branches. Each reference signal $s_b$ consists of six bits of signed value ±1 corresponding to two bits associated with the start state $E_{S(b)}$ and to the bit associated with the branch $B_b$ (i.e. b mod 2). These six signed bits are multiplied by the samples of each segment $r_n$ then summed by the unit 85 to provide the elementary metrics $MB_b(n)$. The SOVA unit 86 operates in the previously described way to deliver the estimations $\hat{D}_m$ of the input bits $D_m$ of the external encoder 82, and the corresponding likelihoods $\Lambda_m$.

These estimations and likelihoods are de-interleaved by a unit 88 which operates the permutation opposite to that of the unit 81 of the transmitter. The internal decoder 89, dual of the internal encoder 80, may then operate the required decoding, with hard or soft decisions $\hat{a}_p$, taking advantage of the likelihood $\Lambda_m$ data on its soft inputs. The result is a saving in the overall binary error rate.

In another version, the internal encoder 80 is a source encoder. In this case, it processes not a symbol stream $a_p$, but a signal to be encoded (audio, video, etc.). It is for example a speech encoder. The associated decoder 89 will be able to exploit likelihood $\Lambda_m$ data as a function of the type of data carried by the bits concerned. For example, for some parameters of a source encoder, it may be preferable to carry out an extrapolation on the basis of previously received parameters rather than accept a new parameter value associated with a small likelihood.

Figure 8:
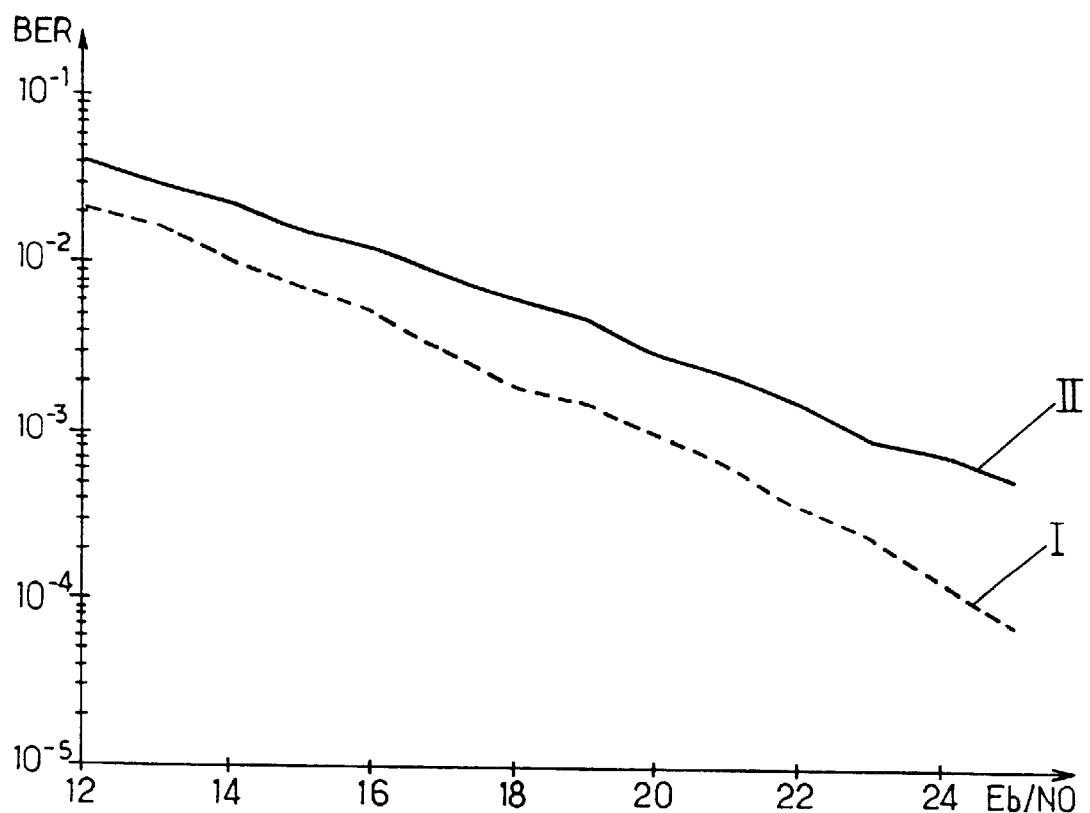
FIG. 8 is a graph showing the improvements in performance obtained by the implementation of the invention in a digital demodulator example.

FIG. 8 shows results obtained by simulating an example of a transmission system according to FIGS. 4 and 5, in which: the channel encoder 60 applies a convolutional code CC(2,1,3) to the binary symbols $a_p$; the unit 61 applies interleaving by blocks of size (20,14); the modulator 62 applies a quaternary CPM with an index of h=⅓; the demodulator 68 estimates quaternary symbols (ND=4, Q=1) by evaluating likelihoods according to equation (10) from a trellis according to FIG. 1; and the decoder 76 operates according to the conventional soft input/hard output Viterbi algorithm. In addition, the demodulator 68 operates two demodulations, one from the beginning of the frame towards the end and the other from the end of the frame towards the beginning, and the decoder 76 provides the decoding of the two series of weighted estimations thus obtained, in order finally to select the symbol set $â_p$ which is subject to the smallest number of error corrections on the frame (cf. EP-A-0 821 500). The curves in FIG. 8 were obtained by simulating a flat fading Rayleigh channel, with a Doppler frequency equal to $2.6 \times 10^{-3}$ times the symbol frequency. The curve I shows the binary error rate (BER) observed as a function of the signal-to-noise ratio Eb/N0 when implementing the invention. The curve II shows the same quantity obtained in the case where the likelihoods $\Lambda_m$ are not used, the channel decoder 76 having hard inputs. It is worth noting the appreciable saving provided by the invention, of about 3 dB of signal-to-noise ratio for a binary error rate of $10^{-2}$, which shows that the performance of the method is very close to that of the MAP.

What is claimed is:

1. A method for detecting a discrete symbol sequence from an observation signal the production of which can be described by means of a trellis of NE states $E_e$ (0≦e<NE) and NB branches $B_b$ (0≦b<NB), each branch having a start state and an arrival state among the NE states and being associated with a single Q-uplet of discrete symbols, Q being an integer at least equal to 1, the trellis comprising paths each formed by a succession of branches, each path having a metric defined by a sum of elementary metrics relative to the successive branches forming said path, and being associated with a single possible sequence of discrete symbols formed by the succession of Q-uplets with which the successive branches forming said path are respectively associated, wherein the observation signal is processed by successive time segments, the processing of a segment n of the observation signal including:

for each of the NB branches $B_b$ (0≦b<NB), obtaining an elementary metric corresponding to a combination between the segment n of the observation signal and a reference signal associated with the branch $B_b$, and the calculation of an accumulated branch metric $MBA_b(n)$ by adding the elementary metric obtained to an accumulated state metric $MEA_e(n-1)$ relative to the start state $E_e$ of the branch $B_b$; and for each of the NE states $E_e$ (0≦e<NE), updating the accumulated state metric $MEA_e(n)$, taken as equal to an optimum of the accumulated branch metrics $MBA_b(n)$ relative to those of the branches $B_b$ which have the state $E_e$ as the arrival state, and storing an identification of a surviving branch for which said optimum is reached, wherein, after processing successive segments of the observation signal, a selection is made of one of the NE states $E_{e0}$ and of an optimal path $\alpha_{opt}$ of the trellis formed by returning up the surviving branches from the selected state, and at least one discrete symbol $D_m$ of the sequence to be detected is estimated by the value of a corresponding symbol of the sequence with which the selected optimal path is associated, wherein, for each symbol $D_m$ of the sequence to be detected, estimated after the selection of a state $E_{e0}$ and of an optimal path $\alpha_{opt}$, a minimum difference in metrics is calculated between the optimal path and a competitor path associated with a sequence in which the symbol corresponding to the symbol $D_m$ has a value other than the estimation retained for the symbol $D_m$, and wherein a likelihood $\Lambda_m$ of the estimation of each symbol $D_m$ is determined as a function of the minimum difference in metrics calculated for said symbol $D_m$.

2. A method according to claim 1, wherein the likelihood $\Lambda_m$ of the estimation of the symbol $D_m$ is taken as equal or proportional to the minimum difference in metrics calculated for the symbol $D_m$.

3. A method according to claim 1, wherein, the symbol $D_m$ having a number ND greater than two of possible values $d^0, \ldots, d^{ND-1}$, ND−1 differences in metrics are calculated relative to the ND−1 possible values other than the estimation $d^i$ retained for the symbol $D_m$, the difference in metrics $\Delta^j$ relative to a value $d^j$ (0≦j<ND, j≠i) being equal to the difference between the metric of the optimal path and the metric of a competitor path relative to the value $d^j$, which offers an optimal metric among all the paths associated with sequences in which the symbol corresponding to the symbol $D_m$ has the value $d^j$, and the minimum difference in metrics for the symbol $D_m$ is determined as being the smallest of the ND−1 differences in metrics relative to the values $d^j$ (0≦j<ND, j≠i).

4. A method according to claim 3, wherein the likelihood $\Lambda_m$ of the estimation of the symbol $D_m$ is taken as equal or proportional to the minimum difference in metrics less a term dependent on the dispersion of the ND−1 differences in metrics relative to the values $d^j$ (0≦j<ND, j≠i).

5. A method according to claim 1, wherein, during the processing of L0+L1 successive time segments n−r of the observation signal up to a segment n (n−L0−L1<n−r≦n), L0 being a positive or zero integer and L1 being a strictly positive integer, for each branch b (0≦b<NB) is stored the difference $\delta_b(n-r)=|MBA_b(n-r)-MEA_e(n-r)|$ between the accumulated branch metric $MBA_b(n-r)$ and the accumulated state metric $MEA_e(n-r)$ updated for the arrival state $E_e$ of the branch $B_b$, and wherein, after the processing of L1 successive segments of the observation signal up to a segment n and the selection of a state $E_{e0}$, a recursive calculation is made on the basis of the differences in metrics stored during the processing of the previous L0+L1 segments n−r (n−L0−L1<n−r≦n), in order to determine the minimum difference in metrics relative to each symbol $D_m$ estimated by means of the sequence with which is associated the optimal path determined by returning up the surviving branches from the selected state.

6. A method according to claim 5, wherein, after the processing of L1 successive segments of the observation signal up to a segment n and the selection of a state, Q×L1 symbols $D_m$ are estimated relative to the previous L1 segments n−r such that n−L0−L1 <n−r≦n−L0, and the respective likelihoods of the estimations of these Q×L1 symbols $D_m$ are determined, the estimations of Q symbols relative to a previous segment n−r being formed respectively by the values of the Q-uplet of symbols with which is associated the (r+1)-th surviving branch of the optimal path covered by returning up from the selected state.

7. A method according to claim 6, wherein, once a state $E_{e0}$ has been selected after the processing of L1 successive segments of the observation signal up to a segment n, state nodes $X_e$ relative to the NE states $E_e$ (0≦e<NE) are initialised according to $X_e = |MEA_e(n) - MEA_{e0}(n)|$, then the following operations are performed for each value of the integer r ranging from 0 to L0+L1−1:

the selection of the surviving branch $B_{b0}$ stored, for the selected state $E_{e0}$, during the processing of the segment n−r, followed by the updating of the selected state $E_{e0}$ taken as being the start state of the surviving branch selected $B_{b0}$;

for each of the NB branches $B_b$ (0≦b<NB), the calculation of a branch note $Z_b$ by adding to the state note $X_e$ relative to the arrival state $E_e$ of the branch $B_b$ the difference in metrics $\delta_b(n-r)$ stored for the branch $B_b$;

for each of the NE states $E_e$ (0≦e<NE), the updating of the state note $X_e$, taken as equal to the smallest of the branch nodes $Z_b$ calculated for those of the branches $B_b$ which have the state $E_e$ as the start state;

if r≧L0, the estimation of Q symbols of the sequence to be detected, by the values of the Q-uplet of symbols with which the surviving branch selected $B_{b0}$ is associated; and if r≧L0, for each estimation d1 accepted for one of the Q symbols $D_m$, the determination of the minimum difference in metrics as being the smallest of the branch nodes $Z_b$ calculated for those of the branches $B_b$ which are associated with Q-uplets in which the symbol corresponding to the symbol $D_m$ has a value $d^j$ different from the estimation $d^i$.

8. A method according to claim 5, wherein the differences in metrics $\delta_b(n-r)$ are stored in storage means in last-in-first-out mode.

9. A Viterbi processor, for detecting a discrete symbol sequence from an observation signal the production of which can be described by means of a trellis of NE states $E_e$ (0≦e<NE) and NB branches $B_b$ (0≦b<NB), each branch having a start state and an arrival state among the NE states and being associated with a single Q-uplet of discrete symbols, Q being an integer at least equal to 1, the trellis comprising paths each formed by a succession of branches, each path having a metric defined by a sum of elementary metrics relative to the successive branches forming said path, and being associated with a single possible sequence of discrete symbols formed by the succession of Q-uplets with which the successive branches forming said path are respectively associated, including elementary metrics calculation means for calculating elementary metrics $MB_b(n)$ each corresponding to a combination between a time segment n of the observation signal and a reference signal associated with one of the NB branches $B_b$, and sequential processing means for processing the observation signal by successive time segments, arranged to carry out, for each segment n of the observation signal, a processing including:

for each of the NB branches $B_b$ (0≦b<NB), the calculation of an accumulated branch metric $MBA_b(n)$ by adding the elementary metric $MB_b(n)$, provided by the elementary metrics calculation means to an accumulated state metric $MEA_e(n-1)$ relative to the start state $E_e$ of the branch $B_b$; and for each of the NE states $E_e$ (0≦e<NE), the updating of the accumulated state metric $MEA_e(n)$, taken as equal to an optimum of the accumulated branch metrics $MBA_b(n)$ relative to those of the branches $B_b$ which have the state $E_e$ as the arrival state, and the storage of an identification of a surviving branch for which said optimum is reached, wherein the sequential processing means are arranged to select one of the NE states $E_{e0}$ and an optimal path $\alpha_{opt}$ of the trellis after processing successive segments of the observation signal, the optimal path $\alpha_{opt}$ being formed by returning up the surviving branches from the selected state, in order to estimate at least one discrete symbol $D_m$ of the sequence to be detected by the value of a corresponding symbol of the sequence with which the selected optimal path is associated, and wherein the sequential processing means are further arranged to calculate, for each symbol $D_m$ of the sequence to be detected, estimated after the selection of a state $E_{e0}$ and an optimal path $\alpha_{opt}$, a minimum difference in metrics between the optimal path and a competitor path associated with a sequence of which the symbol corresponding to the symbol $D_m$ has a value other than the estimation sequence for the symbol $D_m$, and to determine a likelihood $\Lambda_m$ of the estimation of the symbol $D_m$ as a function of the calculated minimum difference in metrics.

10. A Viterbi processor according to claim 9, wherein the sequential processing means determines the likelihood $\Lambda_m$ of the estimation of the symbol $D_m$ as being equal or proportional to the minimum difference in metrics calculated for the symbol $D_m$.

11. A Viterbi processor according to claim 9, including storage means into which the sequential processing means enter for each of the NB branches $B_b$ (0≦b<NB), during the processing of L0+L1 successive time segments n−r of the observation signal up to a segment n (n−L0−L1<n−r≦n), the difference $\delta_b(n-r) = |MBA_b(n-r) - MEA_e(n-r)|$ between the accumulated branch metric $MBA_b(n-r)$ and the accumulated state metric $MEA_e(n-r)$ updated for the arrival state $E_e$ of the branch $B_b$, L0 being a positive or zero integer and L1 being a strictly positive integer, and wherein the sequential processing means are arranged so as to make, after the processing of L1 successive segments of the observation signal up to a segment n and the selection of a state $E_{e0}$, a recursive calculation on the basis of the difference in metrics entered in the storage means, in order to determine the minimum difference in metrics relative to each symbol $D_m$ estimated by means of the sequence with which is associated the optimal path determined by returning up the surviving branches from the selected state.

12. A Viterbi processor according to claim 11, wherein, after the processing of L1 successive segments of the observation signal up to a segment n and the selection of a state, the sequential processing means estimate Q×L1 symbols $D_m$ relative to the previous L1 segments n−r such that n−L0−L1<n−r≦n−L0, and determine the respective likelihoods of the estimations of these Q×L1 symbols $D_m$, the estimations of Q symbols relative to a previous segment n−r being formed respectively by the values of the Q-uplet of symbols with which is associated the (r+1)-th surviving branch of the optimal path covered by returning up from the selected state.

13. A Viterbi processor according to claim 12, wherein, once they have selected a state $E_{e0}$ after the processing of L1 successive segments of the observation signal up to a segment n, the sequential processing means initialise state nodes $X_e$ relative to the NE states $E_e$ (0≦e<NE) according to $X_e=|MEA_e(n)-MEA_{e0}(n)|$, then perform the following operations for each value of the integer r ranging from 0 to L0+L1−1:

- the selection of the surviving branch $B_{b0}$ stored, for the selected state $E_{eO}$, during the processing of the segment n−r, followed by the updating of the selected state $E_{e0}$ taken as being the start state of the surviving branch selected $B_{b0}$;
- for each of the NB branches $B_b$ (0≦b<NB), the calculation of a branch note $Z_b$ by adding to the state note $X_e$ relative to the arrival state $E_e$ of the branch $B_b$ the difference in metrics $\delta_b(n-r)$ stored for the branch $B_b$;
- for each of the NE states $E_e$ (0≦e<NE), the updating of the state note $X_e$, taken as equal to the smallest of the branch nodes $Z_b$ calculated for those of the branches $B_b$ which have the state $E_e$ as the start state;
- if r≧L0, the estimation of Q symbols of the sequence to be detected, by the values of the Q-uplet of symbols with which the surviving branch selected $B_{b0}$ is associated; and
- if r≧L0, for each estimation $d^i$ accepted for one of the Q symbols $D_m$, the determination of the minimum difference in metrics as being the smallest of the branch nodes $Z_b$ calculated for those of the branches $B_b$ which are associated with Q-uplets the symbol of which corresponding to the symbol $D_m$ has a value $d^j$ different from the estimation $d^i$.

14. A Viterbi processor according to claim 11, wherein the storage means are organised in last-in-first out mode.

15. A digital signal demodulator, including channel estimation means to determine, from an observation signal, reference signals respectively associated with NB branches of a trellis, and a Viterbi processor receiving the reference signals and the observation signal distributed in successive segments, and producing estimations of discrete symbols processed by a modulator and likelihoods respectively associated with said estimations, wherein the trellis, describing the production of the observation signal, has NE states $E_e$ (0≦e<NE) and NB branches $B_b$ (0≦b<NB), each branch having a start state and an arrival state among the NE states and being associated with a single Q-uplet of discrete symbols, Q being an integer at least equal to 1, the trellis comprising paths each formed by a succession of branches, each path having a metric defined by a sum of elementary metrics relative to the successive branches forming said path, and being associated with a single possible sequence of discrete symbols formed by the succession of Q-uplets with which the successive branches forming said path are respectively associated, wherein the Viterbi processor comprises elementary metrics calculation means for calculating elementary metrics $MB_b(n)$ each corresponding to a combination between a time segment n of the observation signal and the reference signal associated with one of the NB branches $B_b$, and sequential processing means for processing the observation signal by successive time segments, arranged to carry out, for each segment n of the observation signal, a processing including:

- for each of the NB branches $B_b$ (0≦b<NB), the calculation of an accumulated branch metric $MBA_b(n)$ by adding the elementary metric $MB_b(n)$, provided by the elementary metrics calculation means to an accumulated state metric $MEA_e(n-1)$ relative to the start state $E_e$ of the branch $B_b$; and
- for each of the NE states $E_e$ (0≦e<NE), the updating of the accumulated state metric $MEA_e(n)$, taken as equal to an optimum of the accumulated branch metrics $MBA_b(n)$ relative to those of the branches $B_b$ which have the state $E_e$ as the arrival state, and the storage of an identification of a surviving branch for which said optimum is reached, wherein the sequential processing means of the Viterbi processor are arranged to select one of the NE states $E_{e0}$ and an optimal path $\alpha_{opt}$ of the trellis after processing successive segments of the observation signal. the optimal path $\alpha_{opt}$ being formed by returning up the surviving branches from the selected state, in order to estimate at least one discrete symbol $D_m$ by the value of a corresponding symbol of the sequence with which the selected optimal path is associated, and wherein the sequential processing means of the Viterbi processor are further arranged to calculate, for each symbol $D_m$ estimated after the selection of a state $E_{e0}$ and an optimal path $\alpha_{opt}$, a minimum difference in metrics between the optimal path and a competitor path associated with a sequence of which the symbol corresponding to the symbol $D_m$ has a value other than the estimation retained for the symbol $D_m$, and to determine the likelihood $\Lambda_m$ of the estimation of the symbol $D_m$ as a function of the calculated minimum difference in metrics.

16. A digital signal demodulator according to claim 15, wherein the sequential processing means of the Viterbi processor determines the likelihood $\Lambda_m$ of the estimation of the symbol $D_m$ as being equal or proportional to the minimum difference in metrics calculated for the symbol $D_m$.

17. A digital signal demodulator according to claim 15, wherein the Viterbi processor further comprises storage means into which the sequential processing means enter for each of the NB branches $B_b$ (0≦b<NB), during the processing of L0+L1 successive time segments n−r of the observation signal up to a segment n (n−L0−L1<n−r≦n), the difference $\delta_b(n-r)=|MBA_b(n-r)-MEA_e(n-r)|$ between the accumulated branch metric $MBA_b(n-r)$ and the accumulated state metric $MEA_e(n-r)$ updated for the arrival state $E_e$ of the branch $B_b$, L0 being a positive or zero integer and L1 being a strictly positive integer, and wherein the sequential processing means of the Viterbi processor are arranged so as to make, after the processing of L1 successive segments of the observation signal up to a segment n and the selection of a state $E_{eO}$, a recursive calculation on the basis of the difference in metrics entered in the storage means, in order to determine the minimum difference in metrics relative to each symbol $D_m$ estimated by means of the sequence with which is associated the optimal path determined by returning up the surviving branches from the selected state.

18. A digital signal demodulator according to claim 17, wherein, after the processing of L1 successive segments of the observation signal up to a segment n and the selection of a state, the sequential processing means of the Viterbi processor estimate Q×L1 symbols $D_m$ relative to the previous L1 segments n−r such that n−L0−L1<n−r≦n−L0, and determine the respective likelihoods of the estimations of these Q×L1 symbols $D_m$, the estimations of Q symbols relative to a previous segment n−r being formed respectively by the values of the Q-uplet of symbols with which is associated the (r+1)-th surviving branch of the optimal path covered by returning up from the selected state.

19. A digital signal demodulator according to claim 18, wherein, once they have selected a state $E_{e0}$ after the processing of L1 successive segments of the observation signal up to a segment n, the sequential processing means of the Viterbi processor initialise state nodes $X_e$ relative to the NE states $E_e$ (0≦e<NE) according to $X_e=|MEA_e(n)-MEA_{e0}(n)|$, then perform the following operations for each value of the integer r ranging from 0 to L0+L1−1:

the selection of the surviving branch $B_{b0}$ stored, for the selected state $E_{e0}$, during the processing of the segment n−r, followed by the updating of the selected state $E_{e0}$ taken as being the start state of the surviving branch selected $B_{b0}$;

for each of the NB branches $B_b$ (0≦b<NB), the calculation of a branch note $Z_b$ by adding to the state note $X_e$ relative to the arrival state $E_e$ of the branch $B_b$ the difference in metrics $\delta_b(n-r)$ stored for the branch $B_b$;

for each of the NE states $E_e$ (0≦e<NE), the updating of the state note $X_e$, taken as equal to the smallest of the branch nodes $Z_b$ calculated for those of the branches $B_b$ which have the state $E_e$ as the start state;

if r≧L0, the estimation of Q symbols of the sequence to be detected, by the values of the Q-uplet of symbols with which the surviving branch selected $B_{b0}$ is associated; and if r≧L0, for each estimation $d^i$ accepted for one of the Q symbols $D_m$, the determination of the minimum difference in metrics as being the smallest of the branch nodes $Z_b$ calculated for those of the branches $B_b$ which are associated with Q-uplets the symbol of which corresponding to the symbol $D_m$ has a value $d^j$ different from the estimation $d^i$.

20. A digital signal demodulator according to claim 17, wherein the storage means of the Viterbi processor are organised in last-in-first out mode.

21. A digital signal decoder, including a Viterbi processor receiving an observation signal distributed in successive segments, and producing estimations of discrete symbols processed by an encoder and likelihoods respectively associated with said estimations, wherein the production of the observation signal can be described by means of a trellis of NE states $E_e$ (0≦e<NE) and NB branches $B_b$ (0≦b<NB), each branch having a start state and an arrival state among the NE states and being associated with a single Q-uplet of discrete symbols, Q being an integer at least equal to 1, the trellis comprising paths each formed by a succession of branches, each path having a metric defined by a sum of elementary metrics relative to the successive branches forming said path, and being associated with a single possible sequence of discrete symbols formed by the succession of Q-uplets with which the successive branches forming said path are respectively associated, wherein the Viterbi processor comprises elementary metrics calculation means for calculating elementary metrics $MB_b(n)$ each corresponding to a combination between a time segment n of the observation signal and a reference signal associated with one of the NB branches $B_b$, and sequential processing means for processing the observation signal by successive time segments, arranged to carry out, for each segment n of the observation signal, a processing including:

for each of the NB branches $B_b$ (0≦b<NB), the calculation of an accumulated branch metric $MBA_b(n)$ by adding the elementary metric $MB_b(n)$, provided by the elementary metrics calculation means to an accumulated state metric $MEA_e(n-1)$ relative to the start state $E_e$ of the branch $B_b$; and for each of the NE states $E_e$ (0≦e<NE), the updating of the accumulated state metric $MEA_e(n)$, taken as equal to an optimum of the accumulated branch metrics $MBA_b(n)$ relative to those of the branches $B_b$ which have the state $E_e$ as the arrival state, and the storage of an identification of a surviving branch for which said optimum is reached, wherein the sequential processing means of the Viterbi processor are arranged to select one of the NE states $E_{e0}$ and an optimal path $\alpha_{opt}$ of the trellis after processing successive segments of the observation signal, the optimal path $\alpha_{opt}$ being formed by returning up the surviving branches from the selected state, in order to estimate at least one discrete symbol $D_m$ by the value of a corresponding symbol of the sequence with which the selected optimal path is associated, and wherein the sequential processing means of the Viterbi processor are further arranged to calculate, for each symbol $D_m$ estimated after the selection of a state $E_{e0}$ and an optimal path $\alpha_{opt}$, a minimum difference in metrics between the optimal path and a competitor path associated with a sequence of which the symbol corresponding to the symbol $D_m$ has a value other than the estimation retained for the symbol $D_m$, and to determine the likelihood $\Lambda_m$ of the estimation of the symbol $D_m$ as a function of the calculated minimum difference in metrics.

22. A digital signal decoder according to claim 21, wherein the sequential processing means of the Viterbi processor determines the likelihood $\Lambda_m$ of the estimation of the symbol $D_m$ as being equal or proportional to the minimum difference in metrics calculated for the symbol $D_m$.

23. A digital signal decoder according to claim 21, wherein the Viterbi processor further comprises storage means into which the sequential processing means enter for each of the NB branches $B_b$ (0≦b<NB), during the processing of L0+L1 successive time segments n−r of the observation signal up to a segment n (n−L0−L1<n−r≦n), the difference $\delta_b(n-r)=|MBA_b(n-r)-MEA_e(n-r)|$ between the accumulated branch metric $MBA_b(n-r)$ and the accumulated state metric $MEA_e(n-r)$ updated for the arrival state $E_e$ of the branch $B_b$, L0 being a positive or zero integer and L1 being a strictly positive integer, and wherein the sequential processing means of the Viterbi processor are arranged so as to make, after the processing of L1 successive segments of the observation signal up to a segment n and the selection of a state $E_{e0}$, a recursive calculation on the basis of the difference in metrics entered in the storage means, in order to determine the minimum difference in metrics relative to each symbol $D_m$ estimated by means of the sequence with which is associated the optimal path determined by returning up the surviving branches from the selected state.

24. A digital signal decoder according to claim 23, wherein, after the processing of L1 successive segments of the observation signal up to a segment n and the selection of a state, the sequential processing means of the Viterbi processor estimate Q×L1 symbols $D_m$ relative to the previous L1 segments n−r such that n−L0−L1<n−r≦n−L0, and determine the respective likelihoods of the estimations of these Q×L1 symbols $D_m$, the estimations of Q symbols relative to a previous segment n−r being formed respectively by the values of the Q-uplet of symbols with which is associated the (r+1)-th surviving branch of the optimal path covered by returning up from the selected state.

25. A digital signal decoder according to claim 24, wherein, once they have selected a state $E_{e0}$ after the processing of L1 successive segments of the observation signal up to a segment n, the sequential processing means of the Viterbi processor initialise state nodes $X_e$ relative to the NE states $E_e$ (0≦e<NE) according to $X_e = |MEA_e(n) - MEA_{e0}(n)|$, then perform the following operations for each value of the integer r ranging from 0 to L0+L1−1:

- the selection of the surviving branch $B_{b0}$ stored, for the selected state $E_{e0}$, during the processing of the segment n−r, followed by the updating of the selected state $E_{e0}$ taken as being the start state of the surviving branch selected $B_{b0}$;

- for each of the NB branches $B_b$ (0≦b<NB), the calculation of a branch note $Z_b$ by adding to the state note $X_e$ relative to the arrival state $E_e$ of the branch $B_b$ the difference in metrics $\delta_b(n-r)$ stored for the branch $B_b$;

- for each of the NE states $E_e$ (0≦e<NE), the updating of the state note $X_e$, taken as equal to the smallest of the branch nodes $Z_b$ calculated for those of the branches $B_b$ which have the state $E_e$ as the start state;

- if r≧L0, the estimation of Q symbols of the sequence to be detected, by the values of the Q-uplet of symbols with which the surviving branch selected $B_{b0}$ is associated; and

- if r≧L0, for each estimation $d^i$ accepted for one of the Q symbols $D_m$, the determination of the minimum difference in metrics as being the smallest of the branch nodes $Z_b$ calculated for those of the branches $B_b$ which are associated with Q-uplets the symbol of which corresponding to the symbol $D_m$ has a value $d^j$ different from the estimation $d^i$.

26. A digital signal decoder according to claim 23, wherein the storage means of the Viterbi processor are organised in last-in-first out mode.

* * * * *

UNITED STATES PATENT AND TRADEMARK OFFICE
CERTIFICATE OF CORRECTION

PATENT NO. : 6,389,574 B1
DATED : May 14, 2002
INVENTOR(S) : Fabrice Belveze and Florence Chancel It is certified that error appears in the above-identified patent and that said Letters Patent is hereby corrected as shown below:

Column 16,
Line 54, "$\delta_b(n-r)=IMBA_b(n-r)-MEA_e(n-r)1$" should be
-- $\delta_b(n-r)=|MBA_b(n-r)-MEA_e(n-r)|$ --

Column 17,
Lines 15 and 30, "nodes" should be -- notes --;
Line 36, "d1" should be -- $d^i$ --;

Column 19,
Lines 11, 27 and 36, "nodes" should be -- notes --;

Column 21,
Lines 14, 29 and 38, "nodes" should be -- notes --;

Column 23,
Line 17, "nodes" should be -- notes --;

Column 24,
Lines 7 and 17, "nodes" should be -- notes --.

Signed and Sealed this

Twelfth Day of November, 2002

*Attest:*

*Attesting Officer*

JAMES E. ROGAN
*Director of the United States Patent and Trademark Office*